United States Patent

[11] 3,605,015

[72] Inventor John Alexander Copeland, III
Gillette, N.J.

[21] Appl. No. 3,771
[22] Filed Jan. 19, 1970
[45] Patented Sept. 14, 1971

[73] Assignee Bell Telephone Laboratories, Incorporated
Murray Hill, Berkeley Heights, N.J.

[54] METHOD AND APPARATUS FOR DETERMINING DEEP IMPURITY CONCENTRATION IN SEMICONDUCTORS
7 Claims, 3 Drawing Figs.

[52] U.S. Cl. .......... 324/158 D, 29/593, 317/235 V, 307/261
[51] Int. Cl. .......... G01r 31/22, H01l 7/00
[50] Field of Search .......... 324/158, 158 D; 29/574, 593, 620; 317/235 AQ, 235 V

[56] References Cited
UNITED STATES PATENTS
2,942,329 6/1960 Rutz .......... 29/574

*Primary Examiner*—Herman Karl Saalbach
*Assistant Examiner*—Marvin Nussbaum
*Attorneys*—R. J. Guenther and Arthur J. Torsiglieri

ABSTRACT: The deep impurity concentration of a semiconductor is determined by forming a diode region in the wafer, applying a reverse-bias voltage across the diode, applying a first alternating current to the diode, deriving a second alternating current from the diode, and determining the phase difference of the first and second currents, said difference being proportional to the concentration of deep impurity levels at the edge of the depletion layer. In a preferred embodiment, the phase shift of the second harmonic frequency is used to determine deep level concentration.

INVENTOR
J. A. COPELAND III
BY
Roderick B. Anderson
ATTORNEY

METHOD AND APPARATUS FOR DETERMINING DEEP IMPURITY CONCENTRATION IN SEMICONDUCTORS

BACKGROUND OF THE INVENTION

This invention relates to measurement of the doping density profiles in semiconductor wafers.

An important step in the fabrication of semiconductor devices is the introduction of a controlled impurity density into the semiconductor wafer from which the devices are made. The process of introducing such impurities is called doping, and the most common doping technique is impurity diffusion. Impurity concentration, or doping density, determines the conductivity of the wafer and is therefore one of the most significant parameters of the finished device. Because diffusion typically results in a nonuniform distribution of impurities, it is often important to determine the doping density profile, or impurity distribution, in the wafer.

As described in the copending application of J. A. Copeland III, Ser. No. 724,169, filed Apr. 25, 1968, now U.S. Pat. No. 3,518,545, issued June 30, 1970, the doping profile of a semiconductor wafer can be measured by forming a diode on one surface of the wafer, reverse biasing the diode, directing AC current through the diode, and measuring first and second harmonic frequency voltages across the diode. It can be shown that the first harmonic frequency voltage is proportional to the depth of the diode depletion layer and the second harmonic voltage is proportional to the reciprocal of doping density at the edge of the depletion layer. The depletion layer is the wafer region adjacent the diode junction from which free majority carriers have been removed or depleted due to the reverse-bias voltage. By increasing the reverse bias, one causes the edge of the depletion layer to scan through a wafer section, thereby permitting a profile of the doping density to be recorded.

For most applications, the doping concentration preferably consists of "shallow" impurities; that is, impurity atoms that contribute a majority carrier even in the absence of applied heat or voltage. For example, in *n*-type semiconductors, the shallow impurities are donor atoms having energy levels sufficiently close to the conduction band to be ionized at room temperature, and thereby to contribute a conduction band electron, or majority carrier. It is the density of such shallow impurities that is measured by the aforementioned Copeland application.

Deep level impurities are those that, in the absence of applied temperature or voltage, do not normally contribute a carrier to the semiconductor. In *n*-type semiconductors, deep donors are those having energies below the Fermi level and which are not ionized at the temperature of operation. In operation, however, applied high voltages may ionize the deep donors thereby increasing the majority carrier electron concentration and otherwise significantly affecting device operation. Hence, it is useful to determine the deep impurity level concentration of a semiconductor wafer, if only for quality control purposes; that is, to eliminate those wafers having an excessive deep impurity concentration.

SUMMARY OF THE INVENTION

It is an object of this invention to determine the deep impurity level concentration in semiconductor wafers.

This and other objects of the invention are attained in a process which is readily adapted to be used with the impurity density profiler described above. It can be shown that the phase shift of AC energy applied to the diode region is directly proportional to the deep impurity concentration at the edge of the depletion layer. The phase shift of the second harmonic, however, is proportionately greater than that of the fundamental frequency and is therefore preferred for determining deep impurity concentration.

Accordingly, in the preferred embodiment, AC energy from a source is applied to the diode region of a wafer, energy from the source is doubled in frequency to be used as a reference signal, second harmonic voltage is derived from the diode and its phase is compared with that of the reference. The phase difference of the derived second harmonic and the reference signal is recorded and is indicative of the deep impurity concentration. By changing the bias voltage, one can cause the depletion layer edge to scan the wafer, giving deep impurity indications at successive wafer depth locations.

These and other objects, features, and advantages of the invention will be better understood from a consideration of the following detailed description taken in conjunction with the accompanying drawing.

DRAWING DESCRIPTION

DETAILED DESCRIPTION

Figure 1:
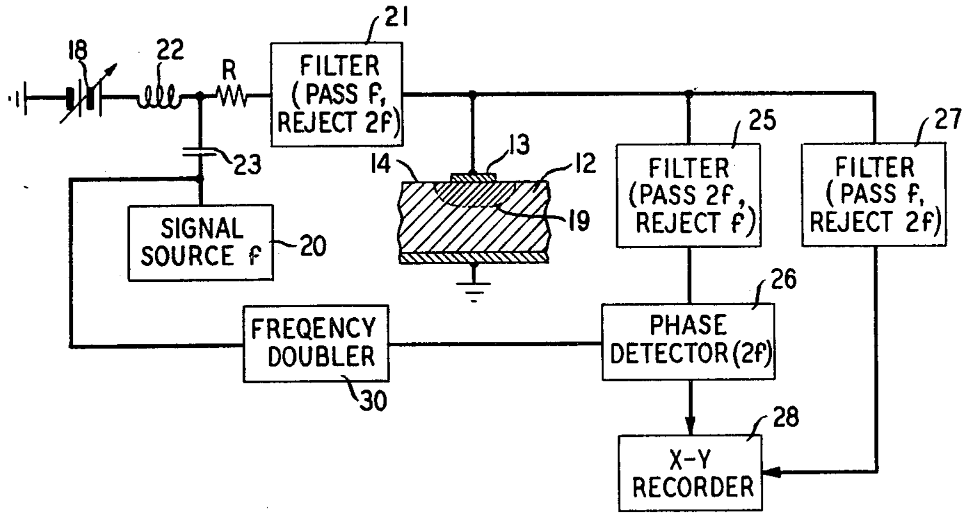
FIG. 1 is a schematic illustration of apparatus for measuring deep impurity concentration in a semiconductor wafer in accordance with an illustrative embodiment of the invention.

Referring now to FIG. 1, there is shown part of a semiconductor wafer 12 which has been impregnated or doped with an impurity as one step in a semiconductor device fabrication process. The conductivity of the wafer is determined by the doping density, which in turn is determined by the shallow impurity concentration of the wafer. A profile of the doping density can be determined by the method described in the aforementioned Copeland application. In addition, it is often useful to determine the concentration of deep impurity levels within the wafer and it is this function to which the circuit of FIG. 1 is directed.

As in the foregoing Copeland process, an array of Schottky barrier contacts 13 are formed on the surface of the wafer to establish a number of Schottky barrier diodes 14, only one of which is shown. Diode 14 is reverse biased by a variable DC voltage source 18 to form a depletion layer beneath contact 13 having an edge or boundary 19. A signal source 20 directs alternating current of frequency $f$ through a resistor R, a filter 21, and the diode. A radiofrequency choke 22 and a capacitor 23 separate and isolate the AC and DC current paths.

As described in the Copeland application, harmonic voltages are developed across the diode in response to the AC current. The second harmonic voltage, of frequency $2f$, is derived from the diode by filter 25 and directed to a phase detector 26. The first harmonic, or fundamental voltage, is derived by a filter 27 and directed to an X–Y recorder 28. The amplitude of the first harmonic voltage from filter 27 is proportional to the depth of the depletion layer and is therefore used to drive the X-coordinate of the X–Y recorder.

The relative phase of the second harmonic output voltage is determined by directing a part of the signal of frequency $f$ to a frequency doubler 30 which generates a reference signal of frequency $2f$ which is then directed to the phase detector 26. The phase detector, which is a standard well-known component, generates an output voltage proportional to the phase difference of second harmonic current from filter 25 and the second harmonic current from frequency doubler 30. This in turn is proportional to the second harmonic voltage phase shift across the diode and is plotted on the Y coordinate by the recorder.

Since the nature and various interactions of deep impurity levels in semiconductors are highly complex, a rigorous explanation of why the second harmonic voltage phase shift is proportional to deep impurity concentration is not considered warranted. It can intuitively be appreciated, however, that the AC component makes the edge 19 of the depletion layer oscillate up and down. As it does so, it ionizes deep donor levels which then changes the capacitance across the depletion layer, thereby changing the phase shift of the derived voltage with respect to applied current. The extent of this capacitance change and resulting phase shift is proportional to the concentration of deep impurity levels in the wafer.

Figure 2:
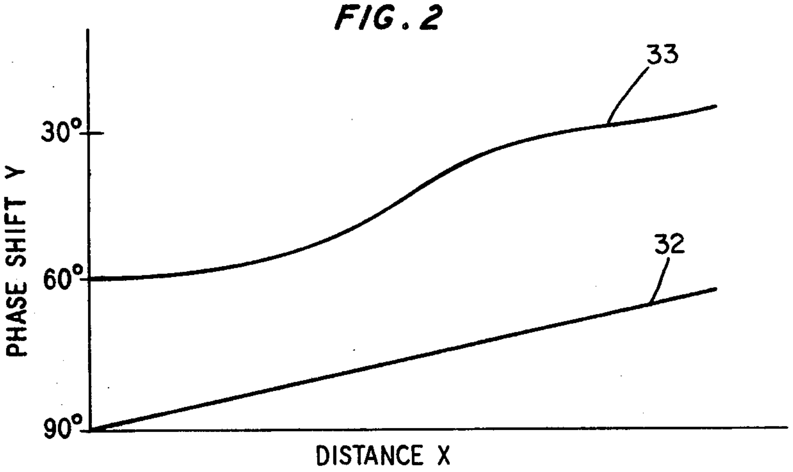
FIG. 2 is a graph of phase shift versus distance in the measuring apparatus of FIG. 1.

Even in the absence of any deep impurity levels is a phase shift of the voltage with respect to applied current which changes as the depletion layer thickness changes. Referring to FIG. 2, curve 32 represents a typical change of phase shift with respect to distance in a wafer that is free of deep impurity levels. The curve is generated by changing the bias applied by variable voltage source 18. As the bias voltage increases, the depletion layer thickness increases, and edge 19 scans through the wafer. The X-coordinate gives the location of the edge 19, and as the distance X increases, the phase shift Y typically increases because of decreased capacitance across the depletion layer. The exact nature of curve 32 depends in part on circuit parameters, and it is recommended that such a curve be determined as a first step in using my circuit; that is, before the circuit is used actually to determine deep impurity concentrations.

A wafer having a substantial impurity concentration may typically cause voltage phase shifts such as to generate a curve 33. The difference in phase shift between curves 33 and 32 at any specific distance is proportional to the deep impurity concentration at that distance location. The specific phase shifts shown are intended to designate the phase shift of the derived second harmonic voltage with respect to applied current. The phase shifts of derived first harmonic voltages are also proportional to deep impurity concentration, but are more difficult to use because such generated phase differences are smaller. The phase shifts of derived second harmonic voltages are typically 10 to 100 times greater than those of comparable first harmonic voltages.

The foregoing technique has been found to be especially useful for quality control of *n*-type gallium arsenide wafers to be used for Gunn-effect diode and LSA diode purposes. Although it is probably possible to determine quantitatively the deep impurity concentration profile with my technique, I have found that the technique is best used empirically; that is, through experience, one determines the extent of phase shift and thus deep impurity concentration that can be tolerated for specific semiconductor functions.

Figure 3:
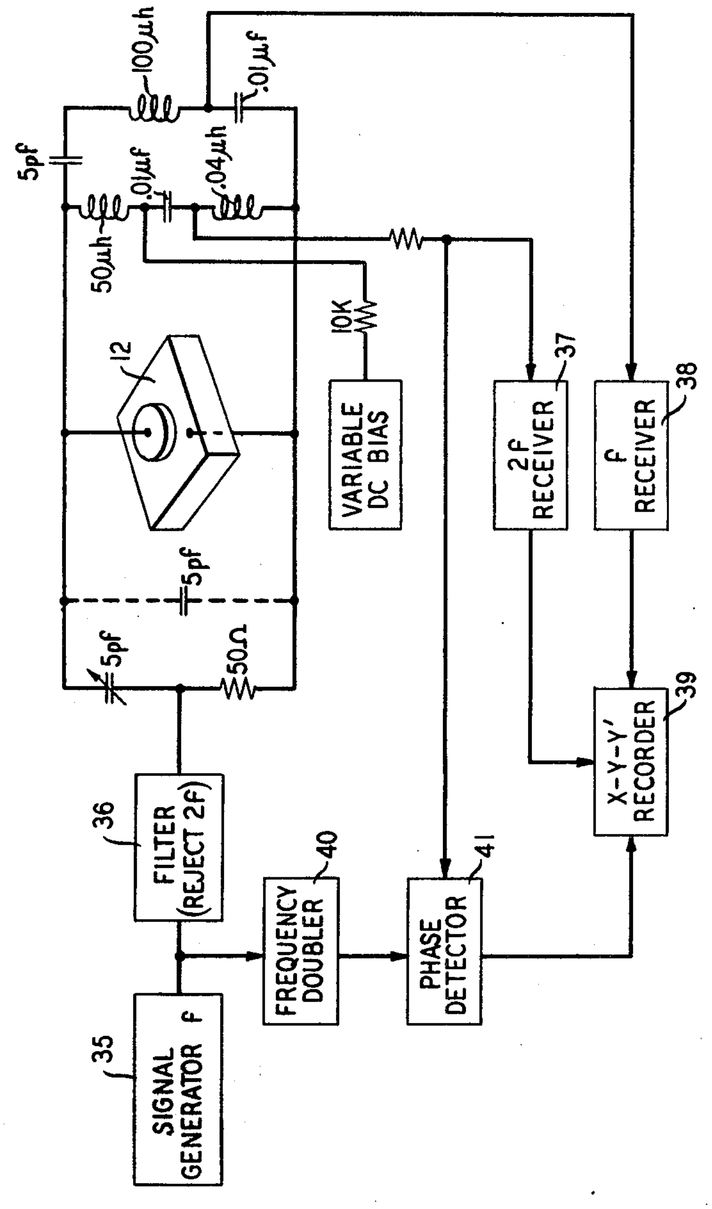
FIG. 3 is a more detailed circuit showing an illustrative implementation of the circuit of FIG. 1.

It is preferred that the foregoing technique be combined with a doping density profiler of the type described in the Copeland application. This combination is shown in the specific circuit of FIG. 3 which has been found to be suitable for analyzing gallium arsenide wafers. The signal generator 35 generates a 5 megahertz signal at 1 volt with a 50 ohm impedance, while filter 36 removes second harmonics at 10 megahertz. The signal is directed by way of a conventional test probe through a Schottky barrier diode formed on the surface of the semiconductor wafer 12. A short wave receiver 37 is tuned to 10 megahertz and detects the second harmonic voltage while a receiver 38 is tuned to 5 megahertz for detecting the first harmonic voltage. 50 ohm transmission lines are used throughout and the values of the various circuit components are indicated on the drawing. The letter K designates kilohms, $\mu f$ is microfarads, $pf$ is picofarads, $\mu h$ is microhenries, and $\Omega$ is ohms. The outputs of receivers 37 and 38 are directed to a recorder 39 to plot the doping density profile in precisely the same manner as described in the Copeland application.

In addition, a second harmonic reference signal is generated by a frequency doubler 40 and directed to a phase detector 41. The second harmonic voltage from the diode is directed to the phase detector 41 as well as to the $2f$ receiver 37. As before, a voltage output from detector 41, indicative of the phase shift of the second harmonic voltage, is directed to recorder 39 to generate a curve such as curve 33 of FIG. 2. This deep impurity concentration curve is superimposed on the doping density profile normally recorded by recorder 39 and therefore constitutes data that can be used conveniently. Recorder 39 is designated an X-Y-Y' recorder because two curves are simultaneously generated as a function of distance X.

The Schottky barrier is only one example of an electronic barrier that can be formed on the surface of the semiconductor to permit reverse biasing with accompanying depletion layer formation. Alternatively, the electronic barrier may be a metal-insulator-semiconductor structure or it may be a PN junction.

Circuits other than those described can be used for determining the voltage phase shift across a wafer diode region, and hence, the concentration of deep impurity levels. Various other embodiments and modifications may be made by those skilled in the art without departing from the spirit and scope of the invention.

What is claimed is:

1. In a process for evaluating semiconductor wafers having an electronic barrier diode region, the steps comprising:

applying a reverse-bias voltage across the diode region, thereby establishing a depletion layer;

applying a first alternating current to the diode region;

deriving a second alternating current from the voltage across the diode region;

and determining the phase difference of the first and second currents, said difference being proportional to the concentration of deep impurity levels at the edge of the depletion layer.

2. The process of claim 1 wherein:

the second current is a second harmonic of the first current;

and the step of determining the phase difference comprises the steps of generating a third alternating current from the first current which is a second harmonic of the first current, and directing the second and third currents to a phase detector.

3. The process of claim 2 further comprising the steps of:

deriving a first harmonic voltage of frequency $f$ from the diode region;

and determining the thickness of the depletion layer comprising the step of measuring the amplitude of the first harmonic voltage, said amplitude being indicative of the thickness of the depletion layer.

4. The process of claim 3 further comprising the steps of:

changing the bias voltage across the diode region, thereby varying the thickness of the depletion layer;

and successively deriving and measuring said first harmonic voltage and said phase difference of the second and third currents, thereby giving indications of the concentration of deep impurity levels at different depths in the wafer.

5. In a process for evaluating a semiconductor wafer having an electronic barrier diode region comprising the steps of applying a reverse-bias voltage across the diode region to form a depletion layer, applying alternating current of frequency $f$ to the diode region, deriving a second harmonic voltage of frequency $2f$ from the diode region, and determining the doping density at an edge of the depletion layer by measuring the amplitude of the second harmonic voltage, the improvement comprising:

determining the relative phase of the second harmonic voltage, thereby to determine the density of deep impurity levels in the depletion layer.

6. The improvement of claim 5 wherein the determining step comprises the steps of doubling the frequency of the alternating current of frequency $f$ to generate a reference signal of frequency $2f$, and directing the reference signal and second harmonic voltage derived from the diode region to a phase detector.

7. In apparatus for evaluating semiconductor wafers which include a diode region comprising means for applying a reverse-bias voltage across the diode region to establish a depletion layer, means for applying alternating current of frequency $f$ to the diode region, means for deriving a second harmonic voltage of frequency $2f$ from the diode region, and means for measuring the amplitude of the second harmonic voltage, said amplitude being indicative of the doping density at the edge of the depletion layer, the improvement comprising:

means for determining the phase shift of the second harmonic voltage derived from the diode with respect to applied alternating current, said difference being indicative of the concentration of deep impurity levels at the edge of the depletion layer.